(12) United States Patent
Hanafi et al.

(10) Patent No.: US 7,176,534 B2
(45) Date of Patent: Feb. 13, 2007

(54) LOW RESISTANCE T-GATE MOSFET DEVICE USING A DAMASCENE GATE PROCESS AND AN INNOVATIVE OXIDE REMOVAL ETCH

(75) Inventors: Hussein I. Hanafi, Basking Ridge, NJ (US); Wesley Natzle, New Paltz, NY (US)

(73) Assignee: International Business Machines Corporation, Armonk, NY (US)

( * ) Notice: Subject to any disclaimer, the term of this patent is extended or adjusted under 35 U.S.C. 154(b) by 259 days.

(21) Appl. No.: 10/659,949

(22) Filed: Sep. 11, 2003

(65) Prior Publication Data

US 2005/0170659 A1  Aug. 4, 2005

Related U.S. Application Data

(62) Division of application No. 10/291,353, filed on Nov. 8, 2002, now Pat. No. 6,656,824.

(51) Int. Cl.
*H01L 29/76* (2006.01)
*H01L 29/94* (2006.01)
*H01L 31/062* (2006.01)
*H01L 31/113* (2006.01)
*H01L 31/119* (2006.01)

(52) U.S. Cl. ............... 257/382; 257/385; 257/E21.205; 257/E21.222; 257/E29.135

(58) Field of Classification Search ................ 257/382, 257/385, E21.205, E21.444, E29.135, E29.266
See application file for complete search history.

(56) References Cited

U.S. PATENT DOCUMENTS

| 5,162,884 | A |   | 11/1992 | Liou et al. |
| 5,282,925 | A |   | 2/1994  | Jeng et al. |
| 5,766,971 | A |   | 6/1998  | Ahlgren et al. |
| 6,040,214 | A |   | 3/2000  | Boyd et al. |
| 6,063,677 | A |   | 5/2000  | Rodder et al. |
| 6,143,635 | A |   | 11/2000 | Boyd et al. |
| 6,261,887 | B1 | * | 7/2001 | Rodder ....................... 438/218 |
| 6,271,094 | B1 |   | 8/2001 | Boyd et al. |
| 6,436,746 | B1 |   | 8/2002 | Chatterjee et al. |
| 6,500,743 | B1 |   | 12/2002 | Lopatin et al. |
| 7,008,832 | B1 | * | 3/2006 | Subramanian et al. ...... 438/182 |
| 2004/0157380 | A1 | * | 8/2004 | Cappellani et al. ......... 438/142 |

* cited by examiner

*Primary Examiner*—Matthew Smith
(74) *Attorney, Agent, or Firm*—Scully, Scott, Murphy & Presser, P.C.; Marian Underweiser, Esq.

(57) ABSTRACT

The present invention provides a method for fabricating low-resistance, sub-0.1 μm channel T-gate MOSFETs that do not exhibit any poly depletion problems. The inventive method employs a damascene-gate processing step and a chemical oxide removal etch to fabricate such MOSFETs. The chemical oxide removal may be performed in a vapor containing HF and $NH_3$ or a plasma containing HF and $NH_3$.

4 Claims, 12 Drawing Sheets

LOW RESISTANCE T-GATE MOSFET DEVICE USING A DAMASCENE GATE PROCESS AND AN INNOVATIVE OXIDE REMOVAL ETCH

RELATED APPLICATION

This application is a divisional of U.S. application Ser. No. 10/291,353, filed Nov. 8, 2002 now U.S. Pat. No. 6,656,824.

FIELD OF THE INVENTION

The present invention relates to semiconductor devices, and more particularly to a low-resistance, damascene T-gate metal oxide semiconductor field effect transistor (MOSFET) device. The present invention also relates to a method of fabricating a low-resistance, damascene T-gate MOSFET which uses damascene-gate processing as well as an innovative oxide removal etch.

BACKGROUND OF THE INVENTION

Over the past twenty-five years or so, the primary challenge of VLSI (very large scale integration) has been the integration of an ever-increasing number of MOSFET devices with high yield and reliability. This was achieved mainly by scaling down MOSFET gate/channel length, reducing gate dielectric thickness and increasing channel doping concentration.

In conventional complementary metal oxide semiconductor (CMOS) processes, the source, drain and gate regions of the MOSFET are implanted, activated annealed and thereafter silicided so as to produce low resistance junction regions in the substrate and poly-gate lines with low-sheet resistance. For high performance 0.1 µm CMOS devices, the conventional process of siliciding the poly-gates results in the following problem: For poly-gates having a width of 0.25 µm or less, nucleation limited growth of the silicided polysilicon, i.e., TiSi, results in very high-sheet resistance which causes reduction in device performance.

In view of the drawback mentioned above concerning conventional CMOS processing of high-performance sub-0.1 µm CMOS devices, there is a continued need for developing a new and improved method which enables the fabrication of high-performance sub-0.1 µm CMOS devices without the devices having high-sheet resistance poly gates. A method is also needed which avoids poly depletion in the gate region which is adjacent to the gate dielectric.

SUMMARY OF THE INVENTION

The present invention provides a method for the fabrication of sub-0.1 µm channel length CMOS devices which have very low-sheet resistance poly-gates. Moreover, the method of the present invention is capable of fabricating sub-0.1 µm CMOS devices which do not exhibit any substantial loss of carriers in the area of the gate that is adjacent to the gate dielectric. That is, the method of the present invention provides sub-0.1 µm CMOS devices which do not exhibit any poly depletion. A further advantage of the present invention is that the inventive method is capable of forming sub-0.1 µm CMOS devices having a reduced gate resistance without increasing the device area.

The inventive method which provides the aforementioned sub-0.1 µm CMOS devices utilizes a damascene-gate processing step as well as a vapor or plasma phase chemical oxide removal (COR) etch. Specifically, the method of the present invention comprises the steps of:

forming a planar structure comprising a Si-containing substrate, a sacrificial oxide layer located atop a surface of said Si-containing substrate, a patterned polysilicon region located atop a portion of said sacrificial oxide layer and a dielectric material abutting said patterned polysilicon region;

removing said patterned polysilicon region to provide an opening exposing a portion of said sacrificial oxide layer and implanting ions into said Si-containing substrate to form a device channel/body implant region, said device channel/body implant region having a length less than 0.1 µm;

forming Si spacers on exposed vertical sidewalls of said dielectric material;

removing said exposed portion of sacrificial oxide layer utilizing a chemical oxide removal etch to expose a surface of said Si-containing substrate;

forming a gate dielectric on the exposed surface of said Si-containing substrate and oxidizing said Si spacers;

forming a recessed poly-gate region in said gate dielectric, said recessed poly-gate having an oxide layer on an upper surface thereof;

laterally etching said oxidized Si spacers and portions of said dielectric material which are above said recessed poly-gate to provide an area which is wider than said recessed poly-gate;

forming a gate conductor in said area and removing remaining dielectric material; and forming nitride spacers on exposed vertical sidewalls of said recessed poly-gate that are beneath said gate conductor.

The present invention also relates to a low-resistance T-gate MOSFET device that is formed utilizing the above described method. Specifically, the low-resistance T-gate MOSFET device of the present invention comprises:

a Si-containing substrate comprising at least one device channel/body implant region separating a source region from a drain region, said at least one device channel/body implant region having a length of less than about 0.1 µm;

a gate dielectric located at least atop said device channel/body implant region, said source region and said drain region;

a T-gate located atop a portion of said gate dielectric, said T-gate comprises a recessed bottom polysilicon region and an upper gate conductor region, said upper gate conductor region has a width that is greater than a width of said bottom polysilicon region; and nitride spacers located on exposed vertical sidewalls of said bottom polysilicon region, said nitride spacers have an outer edge that is aligned with an outer edge of the upper gate conductor region.

DETAILED DESCRIPTION OF THE INVENTION

Figure 1:
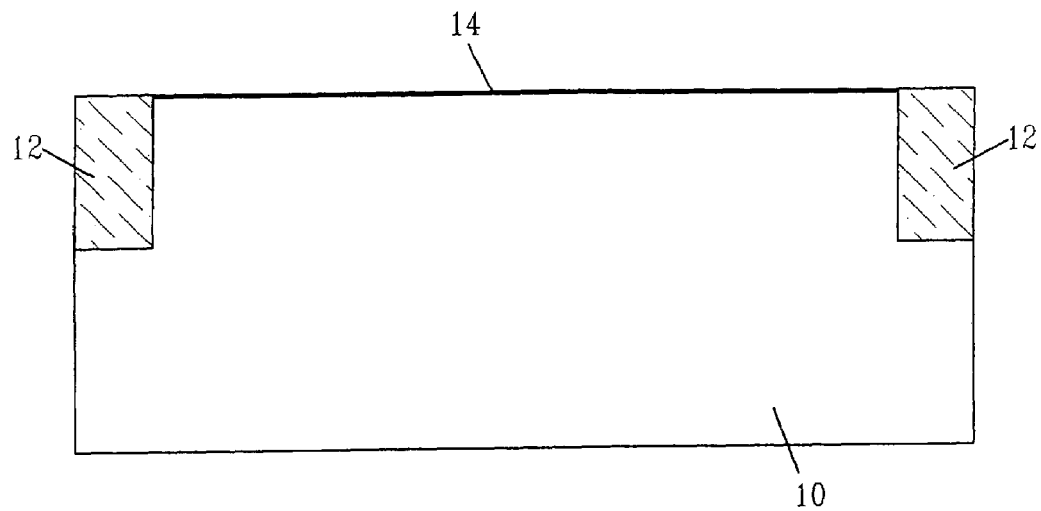
FIGS. 1–13 are pictorial representations (through cross sectional views) showing the basic processing steps of the present invention. It is noted that the drawings of the present invention are not drawn to scale.

The present invention, which provides a method for fabricating a low-resistance T-gate MOSFET device, will now be described in more detail by referring to the drawings that accompany the present application.

FIG. 1 shows an initial structure that is employed in the present invention. Specifically, the initial structure shown in FIG. 1 comprises Si-containing substrate 10 having isolation regions 12 formed therein as well as pad oxide layer 14 located atop a surface of Si-containing substrate 10. The term "Si-containing is used in the present application to denote a material that includes silicon. Illustrate examples of such Si-containing substrates include, but are not limited to: Si, SiGe, SiGeC, SiC, Si/Si, Si/SiC, Si/SiGeC and Si-on-insulator (SOI) where substrate 10 is the top Si-containing layer of the SOI substrate. In the case of SOI substrates, the SOI substrate will include a buried oxide region beneath the top Si-containing layer which serves to electrically isolate the top Si-containing layer from a bottom Si-containing layer. The substrate may be undoped of doped (n- or p-type) depending on the type of device that is being fabricated.

Pad oxide layer 14 is formed atop a surface of Si-containing substrate 10 using a conventional thermal growing process, or alternatively, pad oxide layer 14 may be formed by a conventional deposition process such as, but not limited to: chemical vapor deposition (CVD), plasma-assisted CVD, sputtering, evaporation and other like deposition processes. The thickness of pad oxide layer 14 may vary, but typically, pad oxide layer 14 has a thickness from about 5 to about 20 nm.

After forming the pad oxide layer 14 on the surface of Si-containing substrate 10, isolation regions 12 are formed. The isolation regions may be trench isolation regions, as shown, or LOCOS isolation regions. The LOCOS isolation regions are formed utilizing a conventional local oxidation of silicon process, while the trench isolation regions are formed by lithography, etching and deposition. Specifically, the trench isolation regions are formed by first forming a hardmask (not shown) atop pad oxide layer and then forming a resist atop the hardmask. The resist is then patterned by conventional lithography which includes the steps of: exposing the resist to a pattern of radiation and developing the resist using a conventional resist developer. The pattern, which is typically in the shape of a trench, is then transferred to the hardmask by etching. The etching step includes a conventional dry etching process such as reactive ion etching (RIE), ion beam etching, plasma etching or laser ablation. After the pattern has been transferred to the hardmask, the resist is typically removed utilizing a conventional resist stripping process.

The patterned hardmask that remains is then used to transfer the trench pattern to the substrate by etching through pad oxide layer 14 and portions of substrate 10. Note that in the case of SOI substrates, the trench may be etched partially through the top Si-containing layer or it may be etched entirely through the top Si-containing layer stopping on a top surface of the underlying buried oxide layer. The etching used at this point of the inventive method may be the same or different from the etching step mentioned above.

After the trenches have been etched, an optional liner (not shown) may be formed on the bare surfaces of Si-containing substrate 10 utilizing a conventional deposition process or by a thermal growing technique that is well known to those skilled in the art. Note that the optional liner would be formed on the trench sidewalls as well as the trench bottom wall. The trench, with or without the liner, is then filled with a trench dielectric material such as tetraethylorthosilicate (TEOS), $SiO_2$ or a flowable oxide. The filling step includes a conventional deposition process such as CVD. In some embodiments, for example when TEOS is employed, an optional densification step may be employed prior to planarization.

After filling of the trenches, the structure is subjected to a conventional planarization process stopping atop an upper surface of the hardmask. The hardmask is then removed by etching providing the structure shown, for example, in FIG. 1; during hardmask removal some of the dielectric fill material that is not coplanar with pad oxide layer 14 is removed. It is noted that the drawings of the present invention only depict one area of the Si-containing substrate in which a MOSFET device will be subsequently formed. The other areas of the substrate may include additional MOSFET devices, or other devices which are typically present in CMOS technology.

Figure 2:
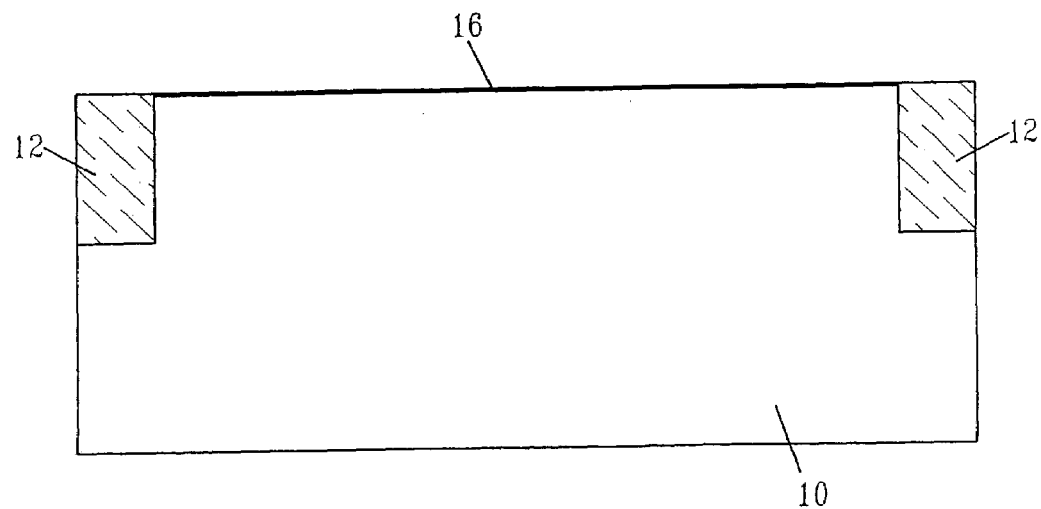

Pad oxide layer 14 is removed from the structure utilizing an etching process that is highly selective in removing oxide as compared to Si or trench fill material and thereafter sacrificial oxide layer 16 is formed on the bare surface of Si-containing substrate 10 so as to provide the structure shown, for example, in FIG. 2. Sacrificial oxide layer 16 may be formed utilizing one of the processes used in forming the pad oxide layer. The thickness of the sacrificial oxide layer may vary, but typically, the sacrificial oxide layer has a thickness of from about 3 to about 15 nm.

Next, patterned polysilicon region 18, which serves as the dummy gate region in the inventive method, is formed atop a portion of sacrificial oxide layer. The patterned polysilicon region is formed by blanket depositing polysilicon on the structure shown in FIG. 2, and then patterning the polysilicon via lithography and etching. The width of the patterned polysilicon region will determine the channel length of the resultant MOSFET device.

Figure 3:
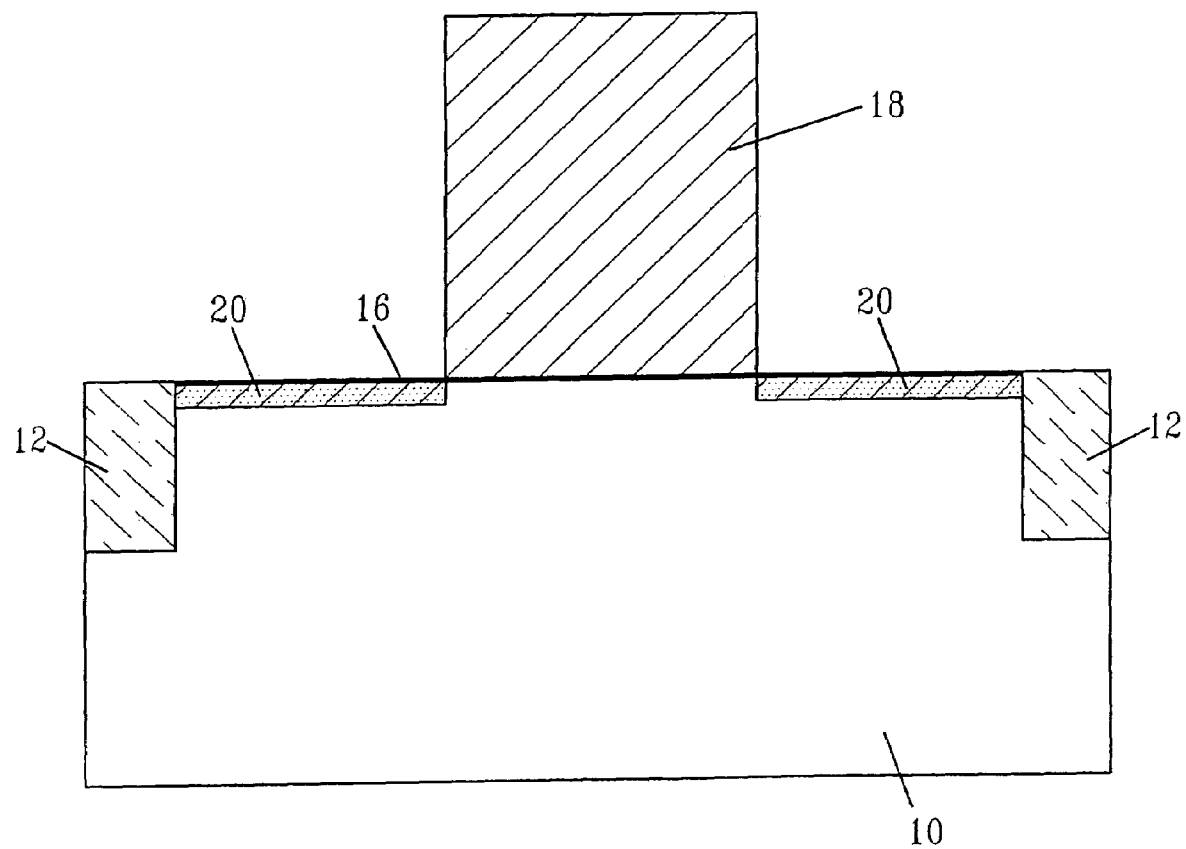

Source/drain extension implants 20 and optional halo implants, not shown, are then formed into the substrate utilizing conventional source/drain extension implants and conventional halo implants. Each implant region may be activated utilizing the same or different activation annealing process. The annealing conditions may vary and are well known to those skilled in the art. The resultant structure including patterned polysilicon region 18 and source/drain extension implant regions 20 is shown, for example, in FIG. 3.

Figure 4:
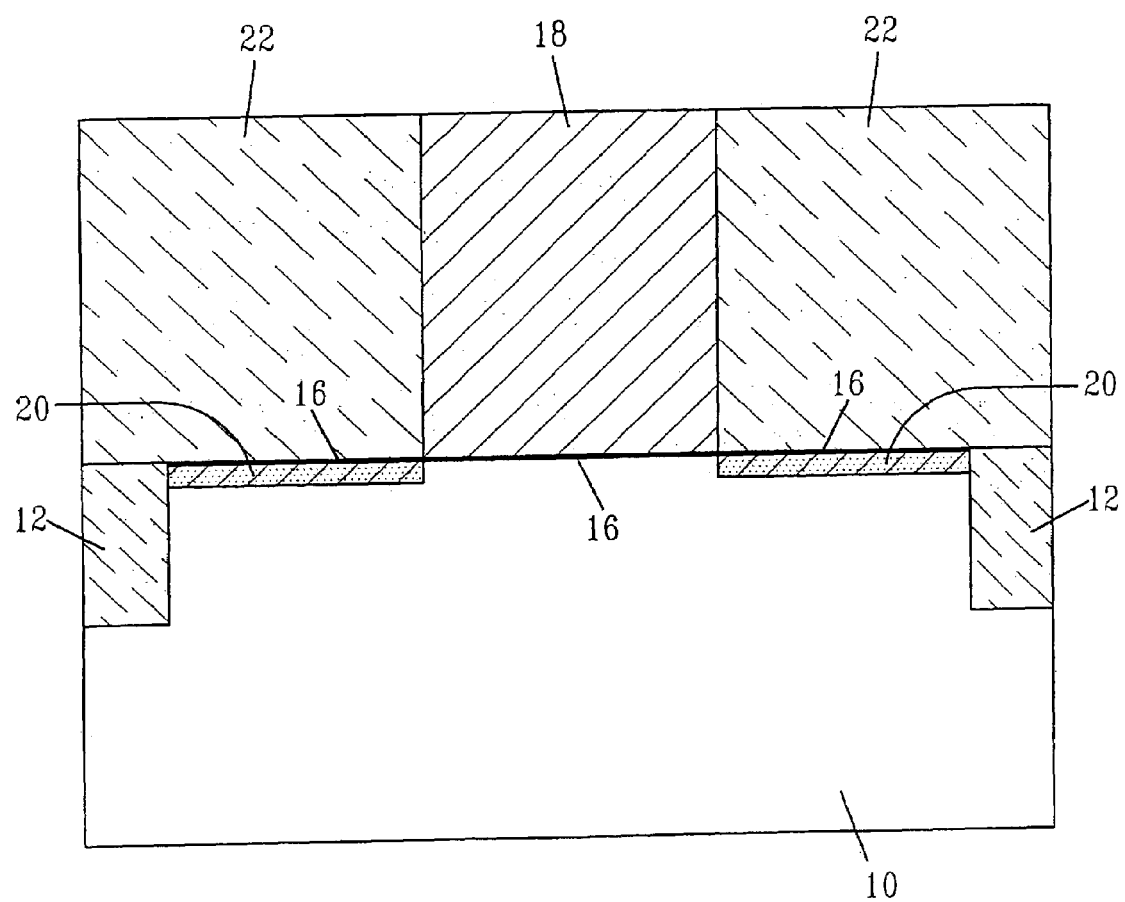

A dielectric material 22 such as TEOS is then deposited via a conventional deposition process and the structure is planarized via a conventional planarization process such as chemical mechanical polishing to provide the planar structure shown, for example, in FIG. 4. Note that the upper surface of the dielectric material abutting the patterned polysilicon region is coplanar with the top surface of the patterned polysilicon region.

Figure 5:
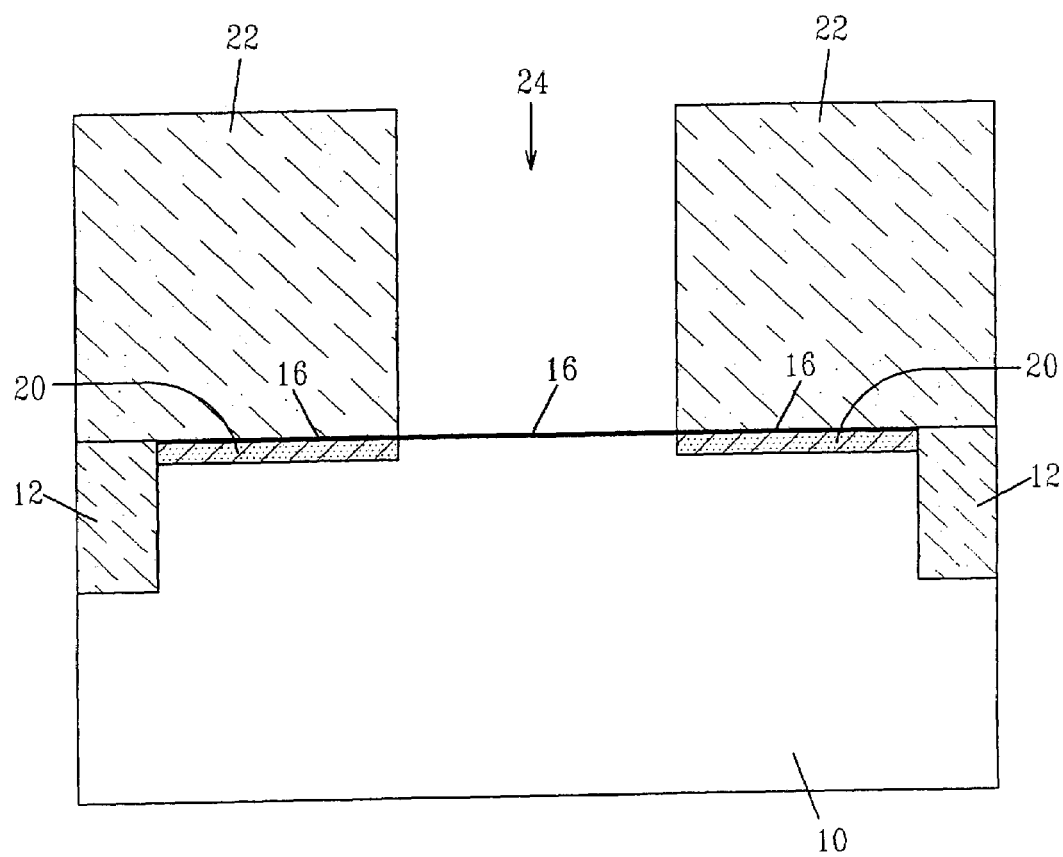

Patterned polsilicon region 18 is then removed from the structure shown in FIG. 4 so as to provide opening 24 that exposes a portion of sacrificial oxide layer 16. The structure formed after removing the patterned polysilicon region is shown, for example, in FIG. 5. The patterned polysilicon region may be removed utilizing chemical downstream etching or a KOH wet etching process may be utilized in removing the patterned polysilicon region.

Figure 6:
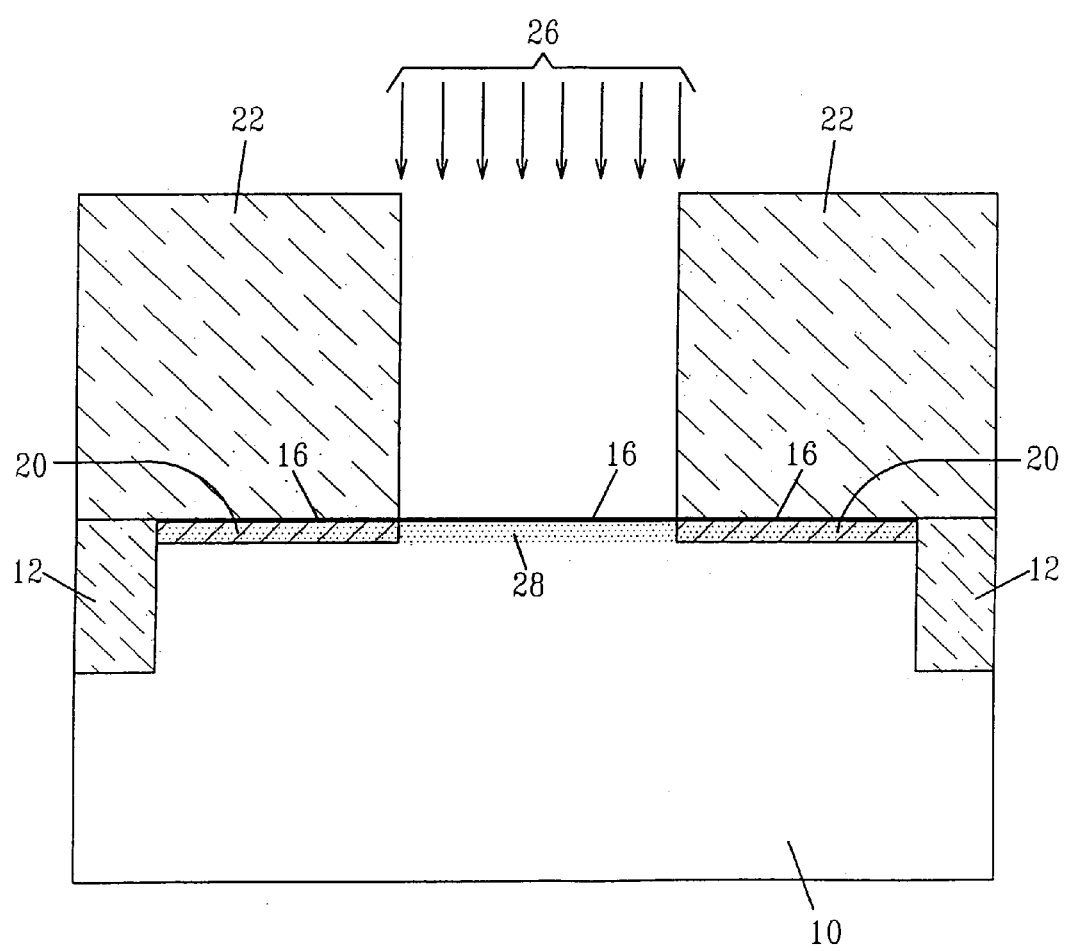

FIG. 6 shows the structure during device channel/body implantation. Reference numeral 26 denotes ions being implanted into the substrate so as to define device channel/body region 28 therein. This implant step of the present invention includes the use of conventional ion implantation. After implantation of the device channel/body region, the implant region is annealed using conditions well known to those skilled in the art. In a preferred embodiment of the present invention, the device channel/body implant is annealed in Ar at 1000° C. for about 5 seconds.

Figure 7:
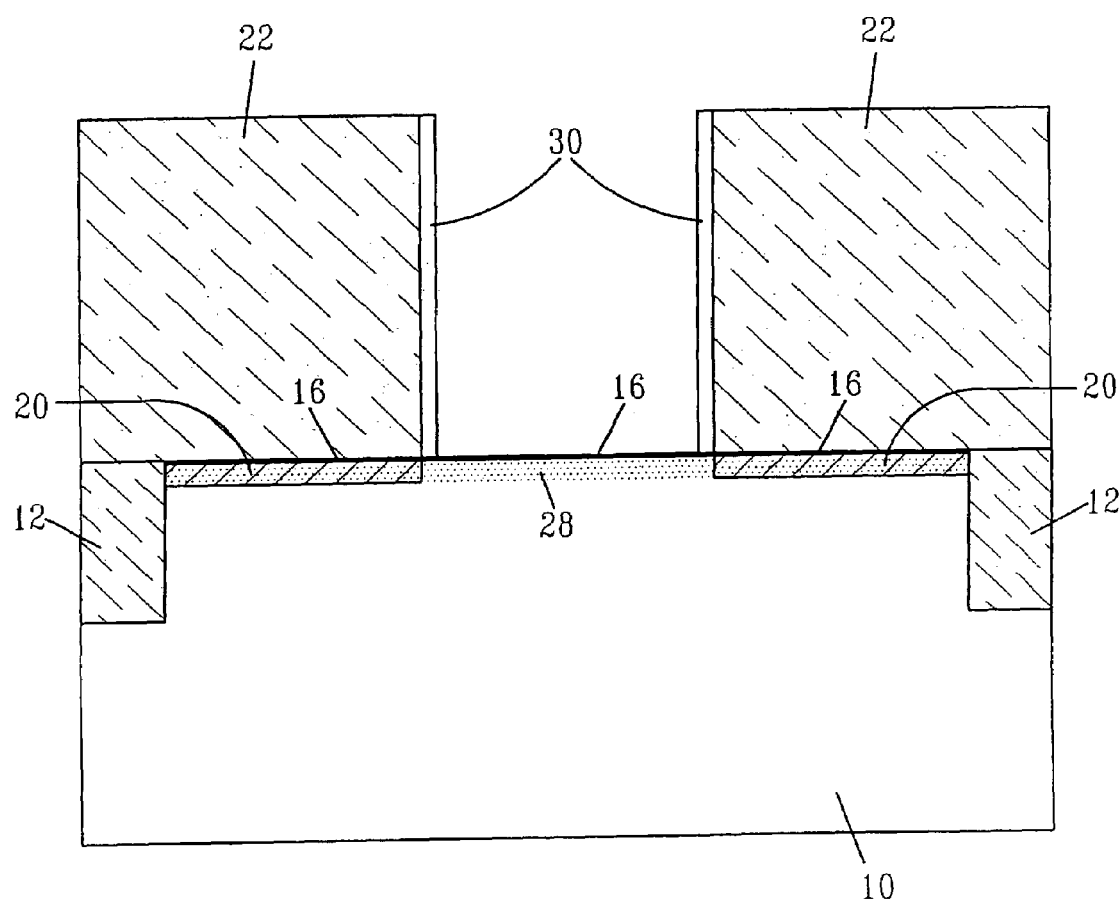

FIG. 7 shows the structure that is formed after Si spacers 30 are formed on the exposed vertical sidewalls of dielectric material 22. The Si spacers are formed by first depositing a layer of Si in opening 24 and then etching the Si layer to provide Si spacers which are located on the exposed vertical sidewalls of dielectric material 22. The thickness of Si spacers 30 is typically from about 0.5 to about 5 nm.

Figure 8:
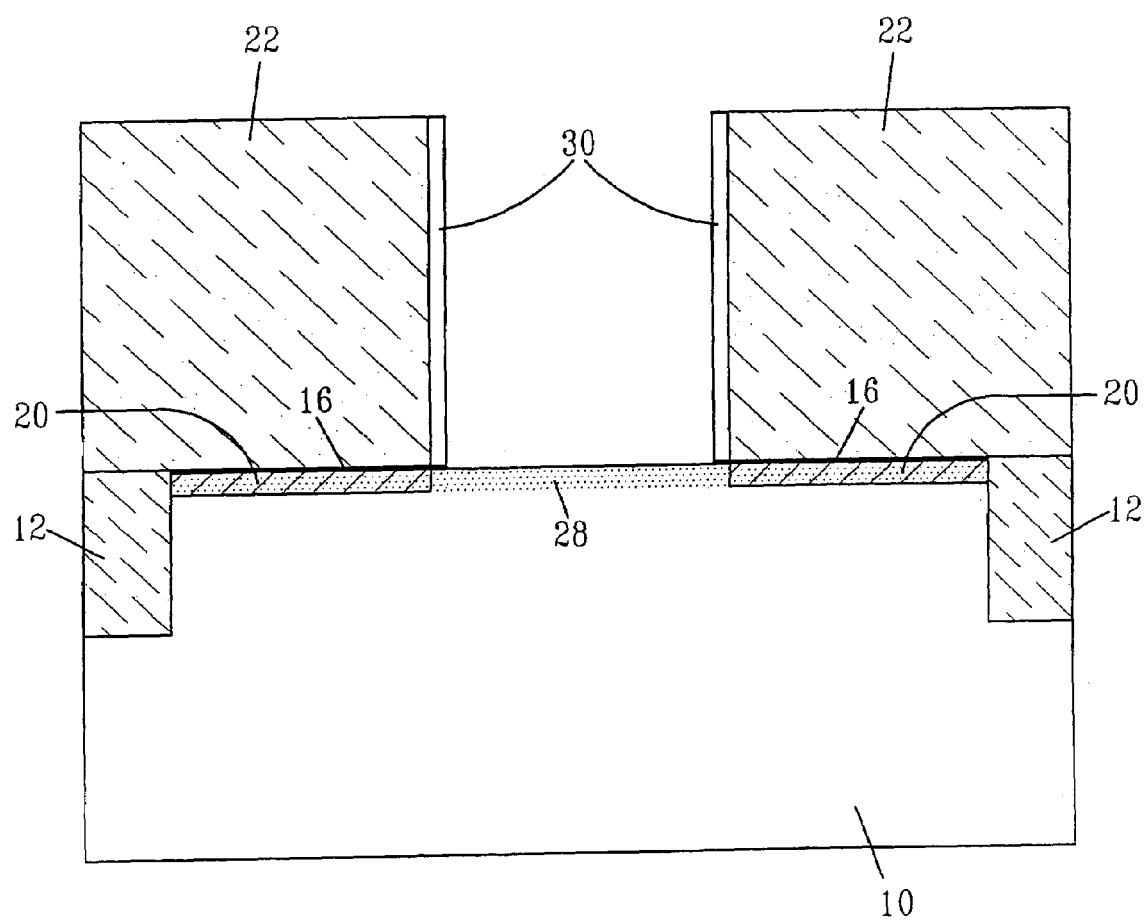

The exposed portion of sacrificial oxide layer 16 in opening 24 is then removed so as to provide the structure shown, for example, in FIG. 8. Specifically, the exposed portion of the sacrificial oxide layer is removed utilizing a chemical oxide removal (COR) etching process wherein a vapor or, more preferably, a plasma of HF and $NH_3$ is employed as the etchant and low pressures (of about 6 millitorr or below) are used. Note that the COR etching provides an undercut beneath the Si spacers and it exposes surface portions of the substrate that lay above the device channel body implant region.

Gate dielectric 32 is then formed on exposed surfaces of the substrate above the device channel/device implant region utilizing a conventional thermal growing process. Note that during gate dielectric formation, Si spacers 30 are exposed forming oxidized Si spacers 31. The gate dielectric may be composed of an oxide including, but not limited to: $SiO_2$, $Al_2O_3$, $Ta_2O_3$, $TiO_2$, and perovskite-type oxides. The gate dielectric material of the present invention may have a dielectric constant of about 3.0 or greater depending on the type of oxide being thermally grown.

It is noted that in some embodiment, the gate dielectric is deposited and thereafter a separate oxidation process can be used to convert the Si spacers into the oxidized Si spacers. Notwithstanding which technique is employed in forming the gate dielectric, the gate dielectric has a thickness of from about 1.0 to about 10 nm.

Figure 9:
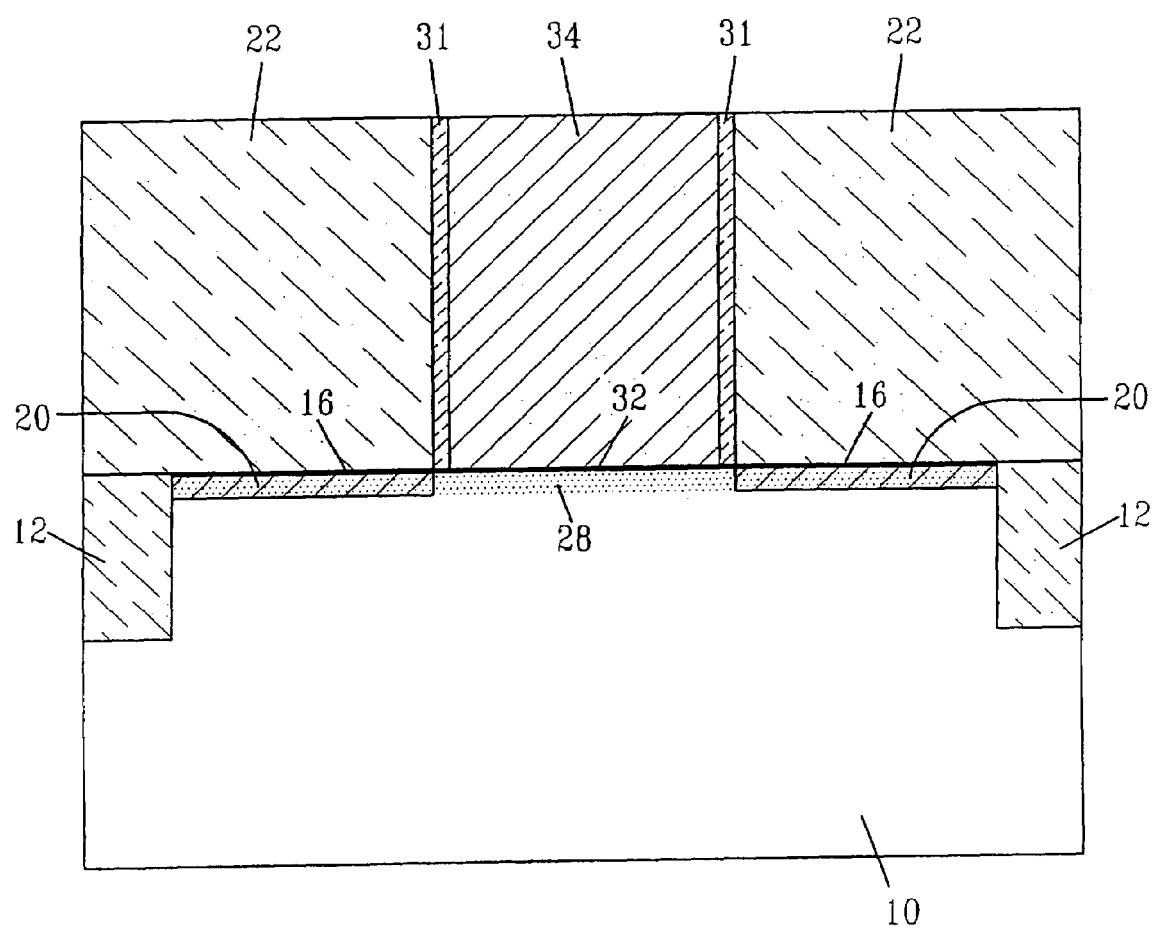

Poly-gate 34 is then formed in the opening atop gate dielectric 32 by depositing a layer of polysilicon and then planarizing the layer of polysilicon so as to be coplanar with the upper horizontal surface of dielectric material 22. Note that the polysilicon deposited may be doped or undoped. When undoped polysilicon is deposited, the undoped polysilicon layer is subjected to poly-gate implantation and annealing after planarization. Although the conditions for annealing may vary, it is preferred to anneal in Ar at 1050° C. for about 5 seconds. The resultant structure including gate dielectric 32, oxidized Si spacers 31 and poly-gate 34 is shown, for example, in FIG. 9.

Figure 10:
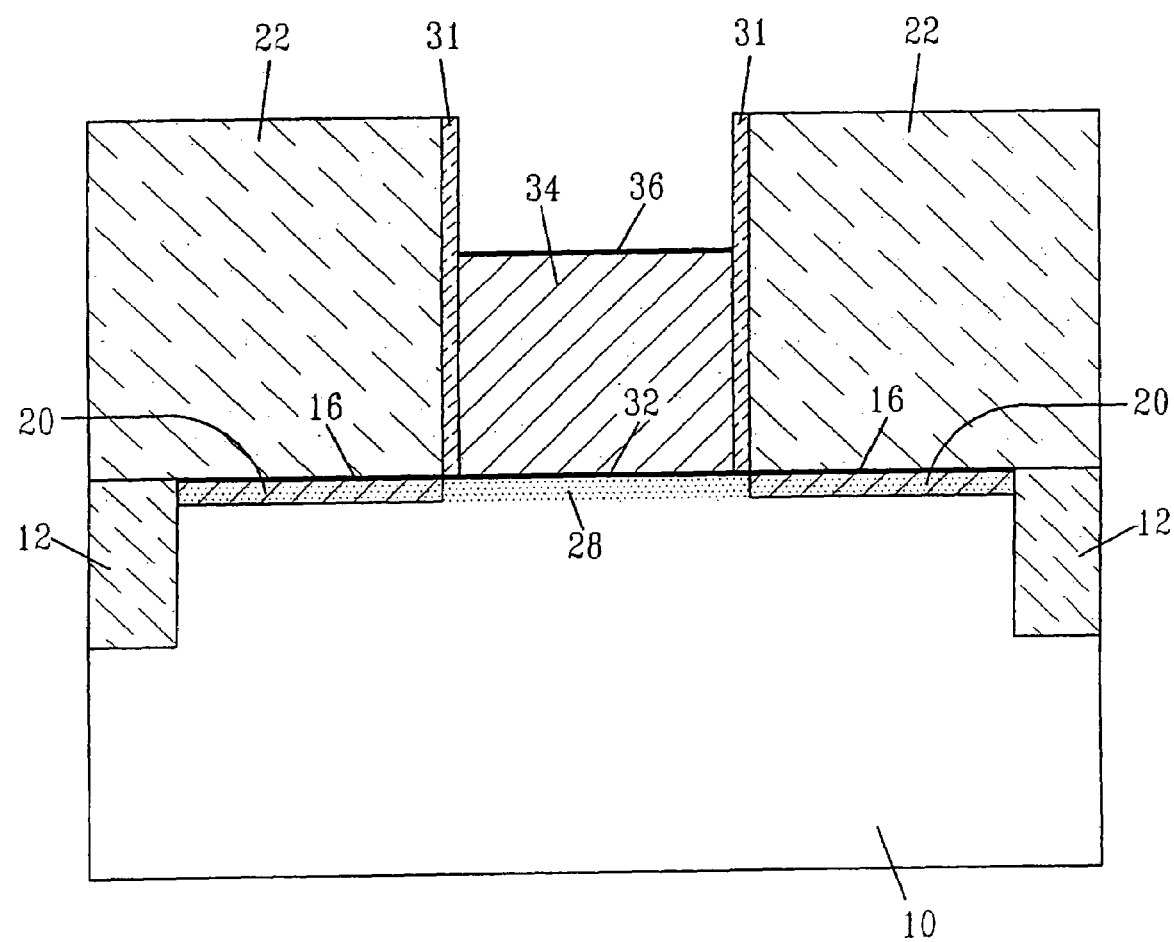

Upper portions of the poly-gate are then recessed utilizing a timed etching process. The recessed poly-gate may optionally be subjected to an oxidation process that forms oxide layer 36 on the upper surface of the recessed poly-gate. See FIG. 10. Note that the second oxidation, if needed, ensures the complete oxidation of the Si spacers.

Figure 11:
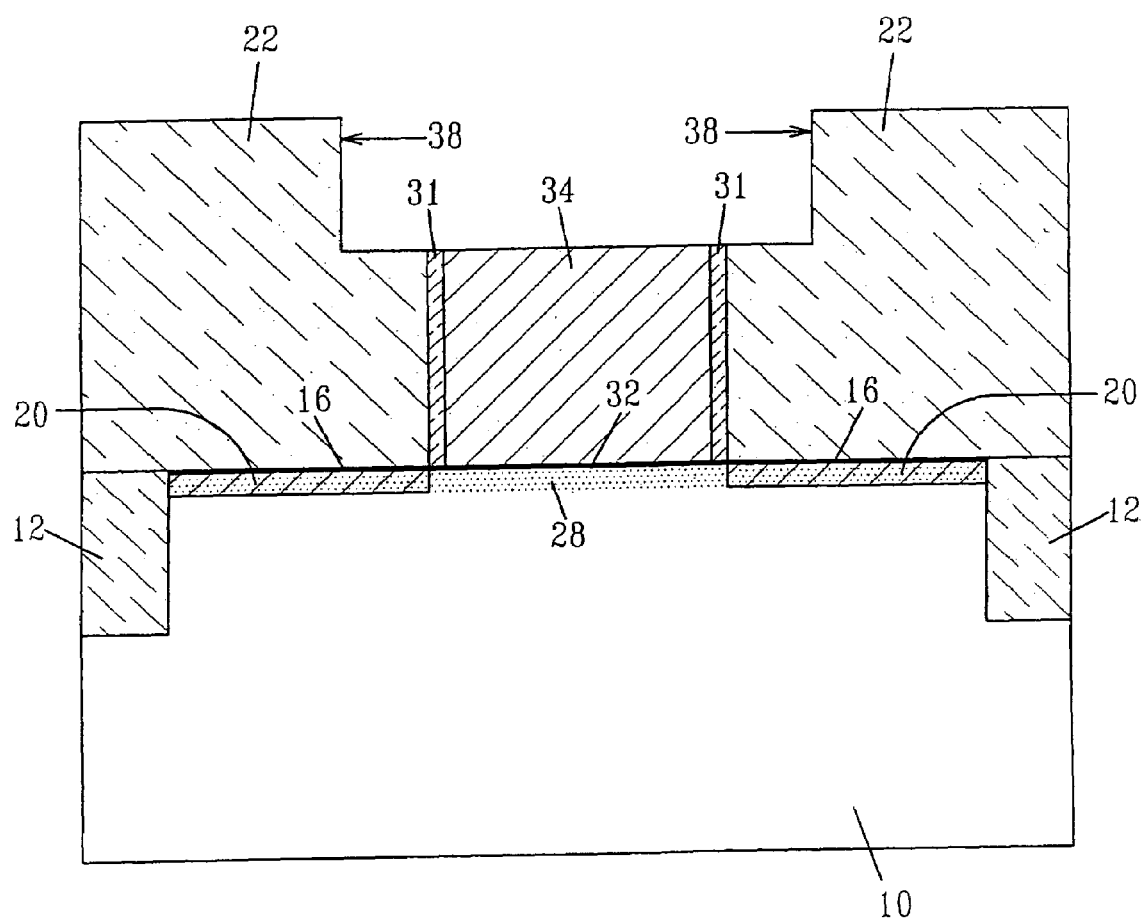

The area for the T-gate is then formed above the recessed poly-gate by removing portions of the oxidized Si spacers and trimming the dielectric material laterally in the direction shown by arrows 38 in FIG. 11. Specifically, an anisotropic COR process such as that mentioned hereinabove is used in forming the T-gate area. Note that the area for the T-gate is wider than the width of the previously formed recessed poly-gate.

Figure 12:
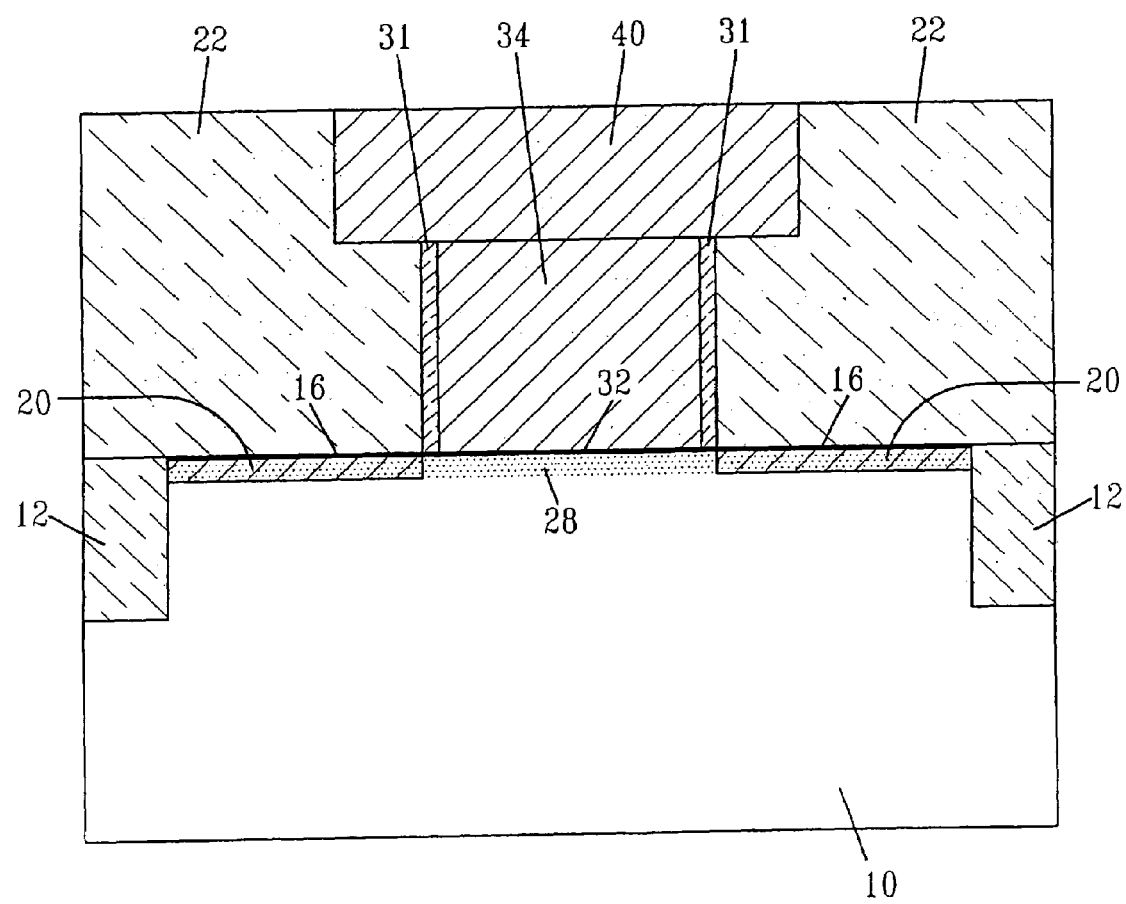

Gate conductor 40 is then predominately deposited in the T-gate area formed in FIG. 11 and planarized to the upper horizontal surface of dielectric material 22 to provide the planar structure shown in FIG. 12. The gate conductor may be polysilicon; a conductive metal such as Al, W, Cu, Ti, and the like; a silicide such as WSi, TiSi, or CoSi; or a combination thereof. In cases when a combination of polysilicon and conductive metal is employed an optional barrier liner is typically formed between the two conductive materials. The barrier liner may also be formed between recessed poly-gate 34 and gate conductor 40, if so desired. Note that gate conductor 40 and recessed poly-gate 34 taken together are referred to as a T-gate since the gate has an upper region, i.e., gate conductor 40 which is wider than a lower region, i.e., recessed poly-gate 34. One preferred conductive material for gate conductor 40 is a conductive stack comprising W formed atop poly Si.

Next, dielectric material abutting the T-gate is removed by utilizing an etching process that is highly selective in removing dielectric material 22 from the structure. Nitride spacers 42 are then formed on exposed portions of the recessed poly-gate such that the outer vertical edge of the nitride spacers is aligned with the outer edge of gate conductor 40. The nitride spacers are formed utilizing a deposition process which is highly conformal. See FIG. 13.

Source/drain regions 44 may then be formed in the substrate adjoining the T-gate by conventional ion implantation and activation annealing. See FIG. 13. Although various activation annealing conditions are employed it is preferred to anneal the source/drain implant in Ar at 1000° C. for about 5 seconds. In some embodiments, especially when substrate 10 is a thin Si-containing layer of an SOI wafer, raised source/drain regions (not shown) are formed next to nitride region 42.

Figure 13:
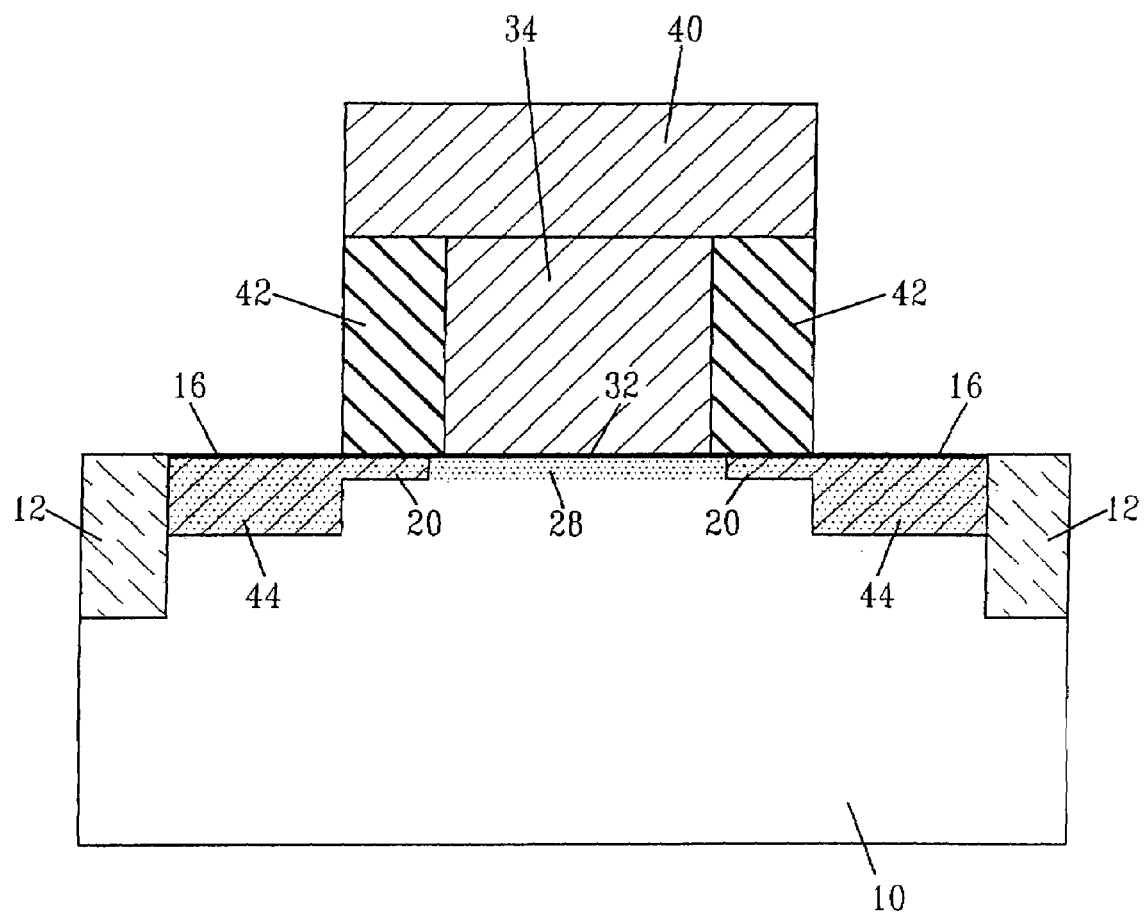

The structure shown in FIG. 13 may be subjected to a conventional silicidation process so as to form silicide regions atop the source/drain regions as well as the T-gate and then conventional CMOS processing steps which are well known to those skilled in the art and are described, for example, in R. Colclaser, "Micro Electronics Processing and Device Design, Chapter 10, pages 266–269, John-Wiley and Sons publisher, 1980.

The inventive method described above utilizes a damascene gate process and a COR etch to fabricate sub-0.1 μm channel length MOSFETs with a T-gate structure. The resultant device has very low-gate sheet resistance enabling very-high device performance for sub-0.1 μm CMOS technologies. The T-gate is formed in the same space which is utilized for the formation of the source and drain spacers in conventional gated devices. Hence, the inventive T-gate technology described herein results in very high-performance MOSFETs with no impact on device packing density. It is further noted that the present invention results in a sub-0.1 μm channel length MOSFET which does not exhibit any poly depletion problems which are typically present in conventional polySi-gated devices.

While the present invention has been particularly shown and described with respect to preferred embodiments thereof, it will be understood by those skilled in the art that the foregoing and other changes in forms and details may be made without departing from the spirit and scope of the present invention. It is therefore intended that the present invention not be limited to the exact forms and details described and illustrated, but fall within the scope of the appended claims.

Having thus described our invention in detail, what we claim is new and desire to secure by the Letters Patent is:

1. A low-resistance T-gate MOSFET comprising:
    a Si-containing substrate comprising at least one device channel/body implant region separating a source region from a drain region, said at least one device channel/ body implant region having a length of less than about 0.1 μm;

a gate dielectric located at least atop said device channel/ body implant region, said source region and said drain region;

a T-gate located atop a portion of said gate dielectric, said T-gate comprises a recessed bottom polysilicon region and an upper gate conductor region, said upper gate conductor region has a width that is greater than a width of said bottom polysilicon region and comprises a lower polysilicon portion and an upper portion including one of Al, W, Cu, Ti and a silicide; and nitride spacers located on exposed vertical sidewalls of said bottom polysilicon region, said nitride spacers have an outer edge that is aligned with an outer edge of the upper gate conductor region.

2. The low-resistance T-gate MOSFET of claim 1 wherein said gate dielectric is an oxide having a dielectric constant of about 3.0 or greater.

3. The low-resistance T-gate MOSFET of claim 1 wherein said Si-containing substrate is a component of a silicon-on-insulator wafer.

4. A low-resistance T-gate MOSFET comprising:

a Si-containing substrate comprising at least one device channel/body implant region separating a source region from a drain region, said at least one device channel/ body implant region having a length of less than about 0.1 μm;

a gate dielectric located at least atop said device channel/ body implant region, said source region and said drain region;

a T-gate located atop a portion of said gate dielectric, said T-gate comprises a recessed bottom polysilicon region and an upper gate conductor region comprising an upper portion of W located on a lower portion of polysilicon, said upper gate conductor region has a width that is greater than a width of said bottom polysilicon region; and nitride spacers located on exposed vertical sidewalls of said bottom polysilicon region, said nitride spacers have an outer edge that is aligned with an outer edge of the upper gate conductor region.

* * * * *